(12) United States Patent
Aruga

(10) Patent No.: US 7,314,268 B2
(45) Date of Patent: *Jan. 1, 2008

(54) CONNECTION APPARATUS FOR CIRCUIT BOARD, INK JET TYPE RECORDING APPARATUS USING THE SAME, IC CHIP AND INK CARTRIDGE HAVING IC CHIP

(75) Inventor: Yoshiharu Aruga, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/484,773

(22) Filed: Jul. 12, 2006

(65) Prior Publication Data

US 2006/0250447 A1 Nov. 9, 2006

Related U.S. Application Data

(62) Division of application No. 10/206,818, filed on Jul. 29, 2002, now Pat. No. 7,101,021.

(30) Foreign Application Priority Data

Jul. 30, 2001 (JP) .......................... P2001-229938

(51) Int. Cl.
*B41J 2/14* (2006.01)
*B41J 2/168* (2006.01)

(52) U.S. Cl. ............................ 347/50; 347/49; 347/59

(58) Field of Classification Search ................. 347/49, 347/50, 59, 51, 9; 439/59–60, 55; 361/737
See application file for complete search history.

(56) References Cited

U.S. PATENT DOCUMENTS

| | | | |
|---|---|---|---|
| 4,350,448 A | 9/1982 | Hanagata et al. | |
| 4,717,345 A | 1/1988 | Gordon et al. | |
| 4,862,197 A | 8/1989 | Stoffel | |
| 5,009,607 A | 4/1991 | Gordon et al. | |
| 5,550,570 A | 8/1996 | Kurata et al. | |
| 5,919,049 A | 7/1999 | Petersen et al. | |
| 5,995,372 A | 11/1999 | Asakura | |
| 6,115,260 A | 9/2000 | Nakajima et al. | |
| 6,151,046 A | 11/2000 | Abe et al. | |
| 6,234,807 B1 | 5/2001 | Amini et al. | |
| 7,101,021 B2* | 9/2006 | Aruga | .................. 347/49 |

FOREIGN PATENT DOCUMENTS

EP 0286258 A2 10/1988

(Continued)

*Primary Examiner*—Lam S. Nguyen
(74) *Attorney, Agent, or Firm*—Sughrue Mion Pllc.

(57) ABSTRACT

A circuit board on an ink cartridge has contact pads which are electrically conducted to a semiconductor storage element mounted on the circuit board. Connector terminals on an ink jet recording apparatus are brought into relative slide contact with a surface of this circuit board, and electrically connected to the contact pads. When the connector terminals come in contact with the contact pads, the dust adhering to the connector terminals is wiped and removed by step portions that are constituted by no-resist-film formation parts and that are adjacent to the contact pads. Consequently, the reliability of the electrical contact between the connector terminals and the contact pads is ensured.

8 Claims, 11 Drawing Sheets

FOREIGN PATENT DOCUMENTS

| | | |
|---|---|---|
| EP | 0532877 A2 | 3/1993 |
| EP | 0900661 A2 | 3/1999 |
| JP | 58-168090 U | 11/1983 |
| JP | 4-133746 A | 5/1992 |
| JP | 05-085040 A | 4/1993 |
| JP | 06-006003 A | 1/1994 |
| JP | 06-206393 A | 7/1994 |
| JP | 07-231153 A | 8/1995 |
| JP | 08-148789 A | 6/1996 |
| JP | 09-169123 A | 6/1997 |
| JP | 10-041599 A | 2/1998 |
| JP | 10-075026 A | 3/1998 |
| JP | 10-242608 A | 9/1998 |
| JP | 10-335771 A | 12/1998 |
| JP | 11-053503 A | 2/1999 |
| JP | 2002-198627 A | 7/2002 |

* cited by examiner

CONNECTION APPARATUS FOR CIRCUIT BOARD, INK JET TYPE RECORDING APPARATUS USING THE SAME, IC CHIP AND INK CARTRIDGE HAVING IC CHIP

This is a divisional of application Ser. No. 10/206,818 filed Jul. 29, 2002, now issued as U.S. Pat. No. 7,101,021. The entire disclosure of the prior application, application Ser. No. 10/206,818 is hereby incorporated by reference.

BACKGROUND OF THE INVENTION

This invention relates to a connection apparatus for a circuit board configured so that connector terminals come in relative slide contact with contact pads formed on a circuit board surface from a direction of a surface of the circuit board and electrically conducted thereto, and also relates to an ink jet type recording apparatus using this connection apparatus for a circuit board. The present invention further relates to an IC chip (a circuit board) having contact pads and a memory device on a base (a substrate), and to an ink cartridge having the IC chip.

For example, an ink jet type recording apparatus is configured so that a plurality of ink cartridges to be used therefor are detachably supported by a cartridge holder and that ink of each color is supplied to a recording head. Recently, there have been provided products of such a kind of a recording apparatus, which are configured so that information on the kind, color, and remaining amount of ink contained in each of the ink cartridges is held at the corresponding ink cartridge, and that the aforementioned information is transferred between a main unit of the recording apparatus and each of the ink cartridges to thereby achieve proper management of a printing operation.

Therefore, the ink cartridge has a circuit board (an IC chip) on which, for instance, a semiconductor storage device (a memory device) being capable of storing the aforementioned information is mounted. In the case that the ink cartridges are loaded in a cartridge holder, the recording apparatus employs a connection apparatus for the circuit board, which is electrically connected between the main unit and each of the ink cartridges of the recording apparatus to thereby enable the transfer of the information therebetween.

FIGS. 10A and 10B (10C) illustrate an example of a circuit board, which is used in the aforementioned recording apparatus. FIG. 10A is a plan view illustrating a state of the circuit board mounted on the ink cartridge, which is taken from above the top surface thereof. FIG. 10B (10C) is an enlarged sectional view illustrating a state of the circuit board shown in FIG. 10A, which is taken in the direction of arrows from line C-C.

A base (a substrate) 61 of the circuit board 27 is constituted by, for example, a glass epoxy resin board, on the surface of which a plurality of contact pads 62 slide-contacted with and electrically conducted to connector terminals (to be described) are formed. Further, solder resist film 63 is applied over the entire surface thereof with the exception of places, at which the contact pads 62 are formed. FIG. 10B shows a case where a minute clearance is formed between an edge of the solder resist film 63 and an edge of the contact pad 62, whereas FIG. 10C shows a case where the edge of the solder resist film 63 is overlaid on the edge of the contact pad 62.

As a result of applying this resist film 63 thereon, circuit patterns (not shown) conducted to the contact pads 62 and formed on the circuit board are coated with the resist film 63. Thus, when the circuit board 27 come in relative slide contact with a plurality of connecter terminals (to be described later), an occurrence of the electrical conduction between the circuit pattern and each of the connector terminals can be prevented. Thus, this recording apparatus prevents an occurrence of a problem that the information or data is destructed by applying an unnecessary drive voltage from the connector terminals to the circuit patterns formed on the circuit board 27 or by short-circuiting the circuit patterns through the connector terminals.

FIG. 11 illustrates a state in which the connector terminals are slide-contacted with the circuit board 27. A semiconductor storage element (a memory device) 65, for instance, EEPROM is mounted on the rear surface of the circuit board 27, and electrically connected to the contact pads 62 through the aforementioned circuit patterns and through holes (not shown). Further, the semiconductor storage element 65 is fixed to the rear surface of the circuit board 27 by a mold resin 66. The circuit board 27 is attached to an end portion of a casing formed from a synthetic resin, which constitutes an outer part of the ink cartridge, in such a way as to place the contact pads 62 on the surface thereof. This circuit board 27 is mounted in a concave portion 67 formed in the end portion of the casing to thereby perform the positioning of the circuit board 27.

Furthermore, when the ink cartridge is loaded into the cartridge holder, the circuit board 27 is adapted so that a connector terminal 70 formed from an elastic metal material placed in the cartridge holder comes in relative slide contact with the circuit board 27 from the direction of the surface of the circuit board 27 in such a way as to cause the connector terminal 70 having a curved end portion to come in contact with the pad 62 provided on the circuit board 27. That is, the circuit board 27 advances in the direction of an arrow D shown in FIG. 11. Thus, the connector terminals 70 are respectively brought into contact with the pads 62 formed on the circuit board 27 and electrically conducted thereto.

Further, a projecting part 68 projecting in the direction of the top surface of the circuit board 27 is formed at a position, at which the circuit board 27 is mounted, on the end portion of the casing. This is performed so as to prevent the end portion of the circuit board 27 from coming in contact with the connector terminals 70. That is, the base 61 of the circuit board 27 is formed like a plate from a glass epoxy resin. This material has a problem that when the connector terminals 70 directly touches the end portion, the glass material chips and thus, the circuit board 27 is damaged. Consequently, the apparatus is deliberately configured so that the end portion of the circuit board 27 does not touch the connector terminals 70.

When the connector terminal 70 is slid on the circuit board 27 and then electrically connected to the pad 62 of the circuit board 27, dust or the like, which exists on the sliding contact path, may be adhered to the connector terminal 70 and intervene between the connector terminal 70 and the pad 62.

In this case, the contact between the pad 62 and the connector terminal 70 becomes insufficient. This disables operations of reading data from and writing data to the semiconductor storage element 65 mounted on the circuit board 27. Thus, in the case of utilizing the apparatus of this configuration in managing the ink cartridges in the ink jet type recording apparatus, obstacles, such as disablement of normal printing operation of the recording apparatus, occur.

Further, in the case where the projecting portion is formed on the circuit board mounting portion at the end of the circuit board, the connector terminals 70 override the projecting part 68 and then come in contact with the surface of the circuit board 27. Since the circuit board 27 advances in the direction of the arrow D. the end portions of the connector terminals 70 are brought into contact with the surfaces of the pads 62 formed on the circuit board 72. Therefore, when the connector terminal 70 overrides the projecting part 68, the surface of the projecting part 68 formed from, for instance, a synthetic resin is subject to friction caused by the connector terminal 70, and thus undergoes an action by which the material is worn.

Also, in this case, the resin material becomes floury dust and adheres to the connector terminal 70. Then, such dust intervenes between the pad 62 and the connector terminal 70.

SUMMARY OF THE INVENTION

This invention is accomplished by focusing attention to the aforementioned problems. Accordingly, an object of the invention is to provide a connection apparatus for a circuit board, which is enabled to prevent an occurrence of long-term electrical poor contacting. Moreover, another object of the invention is to provide an ink jet type recording apparatus enabled to ensure proper printing operation over a long time period. Yet another object of the invention is to provide an IC chip having a structure that can eliminate the aforementioned problems. Still another object of the invention is to provide an ink cartridge having an IC chip that can eliminate the aforementioned problems.

To achieve the foregoing objects, according to an aspect of this invention, there is provided a connection apparatus for a circuit board, which is configured so that a contact pad electrically conducted to circuit patterns arranged on a circuit board is formed on a circuit board surface of the circuit board, and that a connector terminal formed from an elastic metal material is in contact with the contact pad by being in relative slide contact with said contact pad from a direction of a circuit board surface of said circuit board. In this connection apparatus, a projecting part for preventing an end portion of the circuit board from coming in contact with the connector terminal is disposed adjacently to the end portion of the circuit board. A step portion is formed on a slide contact path of the connector terminal between the end portion of the circuit board and the contact pad so that the step portion elastically deforms the connector terminal to rise relative to the circuit board surface.

In this case, preferably, the step portion is formed from metal foil. Further, a preferred embodiment of the invention is configured so that the step portion is formed between a base of the circuit board and a surface of the contact pad. Additionally, preferably, the circuit board is coated with solder resist film with the exception of a place where the contact pad is formed, and a portion that is on the slide contact path of the connector terminal and that is adjacent to the contact pad.

With such a configuration, the end portion of the connector terminal overrides the projecting part and then comes in relative slide contact with the top surface of the resist film formed on the circuit board surface. Subsequently, the end portion falls onto a no-resist-film formation part placed nearest to the contact pad. Finally, the end portion runs upon the top surface of the contact pad, so that the connector terminal is brought into contact with the contact pad. When the connector terminal finally runs upon the top surface of the contact pad, the dust adhering to the connector terminal is wiped and removed by the step portion formed owing to the thickness of the contact pad at the front end part of the contact pad by the action of such a sliding-contact operation.

Therefore, the frequency of causing dust to intervene between the contact pad and the connector terminal can be reduced. The reliability of the electrical contact between the connector terminal and the contact pad can be ensured. Further, the effect of wiping the dust adhering to the connector terminal can be enhanced because the step portion is constituted by metal foil that constitutes the contact pad.

Meanwhile, another preferred embodiment of this invention is configured so that the step portion is formed between the base of the circuit board and the surface of the dummy pattern. In this case, it is desirable that the dummy pattern is insulated from the circuit patterns arranged on the circuit board. Additionally, the dummy patterns separate from one another and correspondingly to the plural connector terminals are preferably employed on the path of the connector terminals coming in slide contact with the contact pads. Furthermore, in each of the aforementioned configurations, preferably, the circuit board is coated with solder resist film so as not to cover the contact pads and portions adjacent to the contact pads on the slide contact path of the connector terminals.

In the case of employing such a configuration, the end portion of the connector terminal overrides the projecting part and then comes in slide contact with the circuit board surface. Subsequently, the end portion runs upon the top surface of the dummy pattern formed from metallic foil. Then, the end portion comes in slide contact with the top surface of the resist film. Finally, the end portion comes in contact with the top surface of the contact pad. When the connector terminal runs upon the top surface of the dummy pattern, the dust adhering to the connector terminal is wiped by the step portion formed owing to the thickness of the dummy pattern at the front end part of the dummy pattern by the action of such a sliding-contact operation. Therefore, the frequency of causing dust to intervene between the contact pad and the connector terminal can be reduced. The reliability of the electrical contact between the connector terminal and the contact pad can be ensured.

Furthermore, to achieve the foregoing objects, according to another aspect of the invention, there is provided an ink jet type recording apparatus configured so that a signal is transferred between a main unit of a recording apparatus and a circuit board mounted on an ink cartridge in a state in which the circuit board is mounted on the ink cartridge, and in which the connector terminal is disposed in a cartridge holder detachably supporting the ink cartridge.

In this case, preferably, the ink jet type recording apparatus is configured so that a readable/writable semiconductor storage element is mounted on the circuit board, and that information on the ink cartridge loaded in the cartridge holder is read from and written to the semiconductor storage element.

According to the ink jet type recording apparatus of the aforementioned configuration, the operations and effects of the aforementioned connection apparatus for a circuit board can be obtained. Moreover, information on the cartridge can be accurately transferred between the cartridge and the main unit of the recording apparatus. Therefore, proper printing operation of the recording apparatus can be assured. The reliability of an operation of such a kind of an ink jet type recording apparatus can be ensured.

The present invention further provides the following arrangements:

(1) An IC chip comprising:
a substrate;
a contact pad on a first surface of the substrate;
a resist film portion on the first surface of the substrate;

a memory device on a second, opposite surface of the substrate, the memory device being electrically connected to the contact pad;

a non-resist film portion exposing the first surface of the substrate, and being located in a first side of the contact pad in a surface direction of the substrate, wherein the non-resist film portion and the contact pad define a step therebetween;

the contact pad and the resist film portion form a clearance therebetween in a second, opposite side of the contact pad in the surface direction of the substrate;

a length of the non-resist portion in the surface direction of the substrate is larger than a length of the clearance in the surface direction of the substrate.

(2) The IC chip according to (1), wherein:

a plurality of said contact pads are disposed to form a staggered arrangement; and a plurality of said non-resist film portions are formed correspondingly to said contact pads to form a staggered arrangement.

(3) The IC chip according to (2), wherein said contact pads are arrayed into two rows, and a width of one row is longer than a width of the other row.

(4) The IC chip according to (3), wherein said non-resist film portions are arrayed into two rows, and the non-resist film portions of one row and the contact pads of the one row are alternately arranged on a straight line parallel to a direction of the rows.

(5) The IC chip according to (1), wherein a height of the step portion is equal to a thickness of the contact pad.

(6) The IC chip according to (1), wherein a surface of the contact pad is substantially flush with a surface of the resist film portion.

(7) The IC chip according to (1), further comprising:

a second resist film portion on the first surface of the substrate, and being located in the first side of the contact pad in the surface direction of the substrate, wherein the non-resist portion is interposed between the second resist film portion and the contact pad in the surface direction of the substrate.

(8) An IC chip comprising:

a substrate;

a contact pad on a first surface of the substrate;

a resist film portion on the first surface of the substrate;

a memory device on a second, opposite surface of the substrate, the memory device being electrically connected to the contact pad;

a dummy pattern on the first surface of the substrate;

a non-resist firm portion exposing the first surface of the substrate, and being located opposite from the contact pad with respect to the dummy pattern in a surface direction of the substrate, wherein the non-resist film portion and the dummy pattern define a step therebetween;

the contact pad and the resist film portion form a clearance therebetween in the surface direction of the substrate;

a length of the non-resist portion in the surface direction of the substrate is larger than a length of the clearance in the surface direction of the substrate.

(9) The IC chip according to (8), wherein:

a plurality of said contact pads are disposed to form a staggered arrangement; and a single of said dummy pattern is formed correspondingly to all of said contact pads.

(10) The IC chip according to (8), wherein:

a plurality of said contact pads are disposed to form a staggered arrangement; and a plurality of said dummy patterns separated one from another are formed correspondingly to said contact pads to form a staggered arrangement.

(11) The IC chip according to (9), wherein said contact pads are arrayed into two rows, and a width of one row is longer than a width of the other row.

(12) The IC chip according to (10), wherein said contact pads are arrayed into two rows, and a width of one row is longer than a width of the other row.

(13) The IC chip according to (8), wherein a height of the step portion is equal to a thickness of the dummy pattern.

(14) The IC chip according to (8), wherein a surface of the contact pad is substantially flush with a surface of the resist film and a surface of the dummy pattern.

(15) The IC chip according to (8), further comprising:

a second resist film portion on the first surface of the substrate, wherein the second resist film portion is interposed between the dummy pattern and the contact pad in the surface direction of the substrate.

(16) An ink cartridge comprising:

a housing having a recessed portion;

the IC chip recited in anyone of (1) to (15) and attached to the recessed portion.

(17) The ink cartridge according to (16), further comprising:

a projecting portion on the housing and adjacent to the recessed portion, wherein:

the projecting portion is located opposite from the contact pad with respect to the non-resist film portion in the surface direction of the substrate, and the projecting portion extends beyond the contact pad in a direction perpendicular to the surface direction of the substrate.

(18) An ink jet recording apparatus comprising:

a carriage having a connector terminal;

an ink cartridge mountable onto the carriage, the ink cartridge including:

a housing having a recessed portion;

the IC chip recited in any one of (1) to (15) and attached to the recessed portion, wherein:

when the ink cartridge is mounted onto the carriage, the connector terminal is electrically connected to the contact pad after the connector terminal is slidingly contacted with the first surface of the substrate through the non-resist film portion and wiped by the step portion.

(19) An ink jet recording apparatus comprising:

a carriage having a connector terminal;

an ink cartridge mountable onto the carriage, the ink cartridge including:

a housing;

an IC chip attached to the housing, the IC chip having:

a substrate;

a contact pad on a first surface of the substrate;

a recessed portion on the first surface of the substrate, wherein the recessed portion has a bottom recessed relative to a surface of the contact pad and defines a step portion at an edge of the bottom;

when the ink cartridge is mounted onto the carriage, the connector terminal is electrically connected to the surface of the contact pad after the connector terminal is slidingly contacted with the bottom of the recessed portion and wiped by the step portion.

(20) The ink jet recording apparatus according to (19), wherein the recessed portion is adjacent to the contact pad, and the step portion is defined between the contact pad and the recessed portion.

(21) The ink jet recording apparatus according to (19), further comprising:
a dummy pattern on the first surface of the substrate and adjacent to the recessed portion, wherein the step is defined between the dummy pattern and the recessed portion.
(22) The ink jet recording apparatus according to (19), further comprising:
a memory device located on a second, opposite surface of the substrate and electrically connected to the contact pad.
(23) The ink jet recording apparatus according to (19), wherein the recessed portion is formed by exposing a part of the first surface of the substrate without applying a resist film onto that part.
(24) A circuit board comprising:
a substrate;
a contact pad formed on a first surface of the substrate, and to be connected to a connector terminal by coming in sliding contact with the connector terminal; and
a step portion formed by the first surface and the contact pad, and located at an upstream side of the contact pad in a direction in which the connector terminal is connected to the contact pad.
(25) A circuit board comprising:
a substrate;
a contact pad formed on a first surface of the substrate, and to be connected to a connector terminal by coming in sliding contact with the connector terminal;
a dummy pattern formed on the first surface, and at least partially aligned with the contact pad along a direction in which the connector terminal is connected to the contact pad; and
a step portion formed by the first surface and the dummy pattern, and located at an upstream side of the contact pad in the direction in which the connector terminal is connected to the contact pad.
(26) The circuit board according to (24) or (25), further comprising:
a resist film portion on the first surface; and
a non-resist film portion having the step portion.
(27) The circuit board according to (24), wherein
a plurality of the contact pads are disposed to form a staggered arrangement;
a plurality of non-resist film portions are disposed correspondingly to the contact pads to form a staggered arrangement;
each of the non-resist film portions has a corresponding one of the step portions.
(28) The circuit board according to (24) or (25), further comprising:
a memory device on a second surface of the substrate opposite from the first surface.
(29) The circuit board according to (25), wherein a plurality of the dummy patterns are disposed.
(30) The circuit board according to (29), wherein:
a plurality of the contact pads are disposed to form a staggered arrangement;
the plurality of the dummy patterns are disposed correspondingly to the contact pads to form a staggered arrangement.
(31) The circuit board according to (24), wherein a height of the step portion is substantially equal to a thickness of the contact pad.
(32) The circuit board according to (25), wherein a height of the step portion is substantially equal to a thickness of the dummy pattern.

(33) An ink cartridge comprising:
an ink storing portion storing at least ink;
an ink supply port communicating with the ink storing portion; and
the circuit board recited in any one of (24), (25), (27), (29), (30), (31) and (32).
(34) The ink cartridge according to (33), further comprising:
a mounting portion at which the circuit board is mounted to the ink cartridge;
a projecting portion located at an upstream side of the mounting portion in the direction in which the connector terminal is connected to the contact pad,
wherein the projecting portion extends beyond the contact pad.

The present disclosure relates to the subject matter contained in Japanese patent application No. 2001-229938 (filed on Jul. 30, 2002), which is expressly incorporated herein by reference in its entirety.

DESCRIPTION OF THE PREFERRED EMBODIMENT

Figure 1:
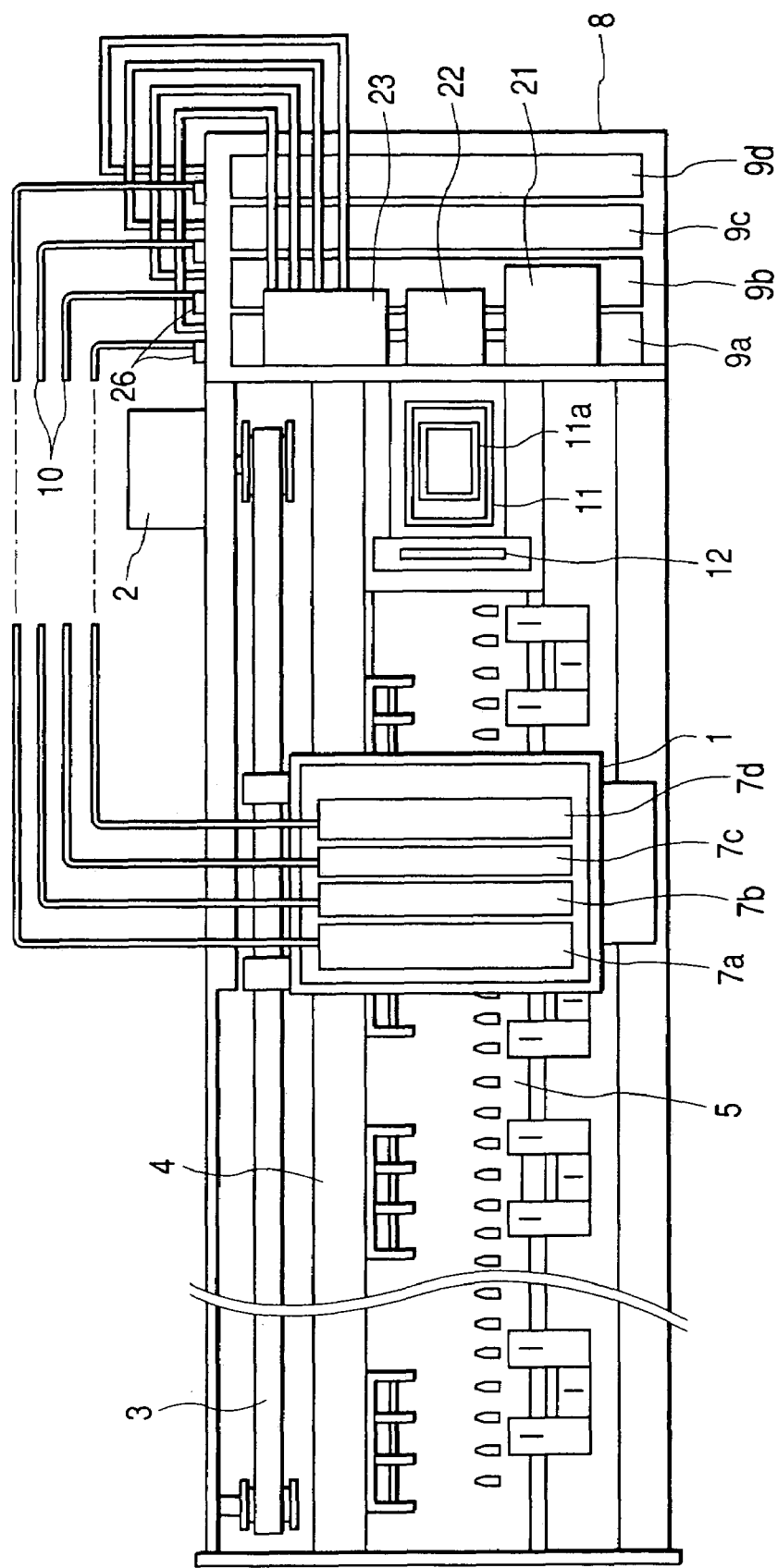
FIG. 1 is a plan view illustrating the entire configuration of an ink jet type recording apparatus to which this invention is applied.

Hereinafter, an embodiment of this invention, which is a connection apparatus for a circuit board according to this invention applied to an ink jet type recording apparatus, is described. Referring first to FIG. 1, there is shown a top view of the entire configuration of the ink jet type recording apparatus that can preferably utilize this invention. In FIG. 1, reference character 1 designates a carriage. This carriage 1 is configured so as to reciprocatively be moved in a longitudinal direction of a paper feed member 5 guided by a scanning guide member 4, that is, a main scanning direction, which is a direction of width of recording paper, through a timing belt 3 driven by a carriage motor 2. Further, although not shown in FIG. 1, an ink jet type recording head 6 (to be described later) is mounted on the carriage 1.

Furthermore, subtanks 7a to 7d for supplying ink to the recording head are mounted on the carriage 1. In this embodiment, these subtanks 7a to 7d are four tanks, each of which is provided in such a way as to temporarily store a corresponding kind of ink and as to correspond to a corresponding one of colors of ink (for instance, black ink, and yellow ink, cyan ink, and magenta color ink).

Further, this embodiment is configured so that black ink and such kinds of color ink are supplied to these subtanks 7a to 7d through flexible ink supply tubes 10, . . . , 10 respectively constituting supply lines from ink cartridges (hereunder referred to as main tanks) 9a to 9d loaded in the cartridge holder, which is placed in the main unit of the recording apparatus.

On the other hand, a capping means 11 enabled to cover a nozzle orifice of a recording head is disposed at a nonprint area (or a home position) on a movement path of the carriage 1. Furthermore, a capping member 11a formed from an elastic material, such as rubber, and enabled to seal the nozzle formation surface of the recording head the top surface of this capping means 11 by being brought into intimate contact therewith. Further, when the carriage 1 moves to the home position, the capping means 11 moves (or rises) to the recording head, so that the nozzle formation surface of the recording head can be sealed with the capping member 11a.

This cap member 11a functions as a cap element for sealing the nozzle formation surface of the recording head during an idle period of the recording apparatus, and for preventing a nozzle opening from drying. Further, an end of a tube of a suction pump (that is, a tube pump) is connected to this cap member 11a. The cap member 11a is adapted to perform a cleaning operation of causing a negative pressure, which is generated by the suction pump, to act upon the recording head, and sucking and discharging ink from the recording head.

Meanwhile, a wiping member 12 formed like a strip and made of an elastic material, such as rubber, is placed adjacently to a print area of the capping means 11, and configured so as to advance in a horizontal direction to the movement path of the recording head, as occasion demands, and wipe and clean the nozzle formation surface.

Figure 2:
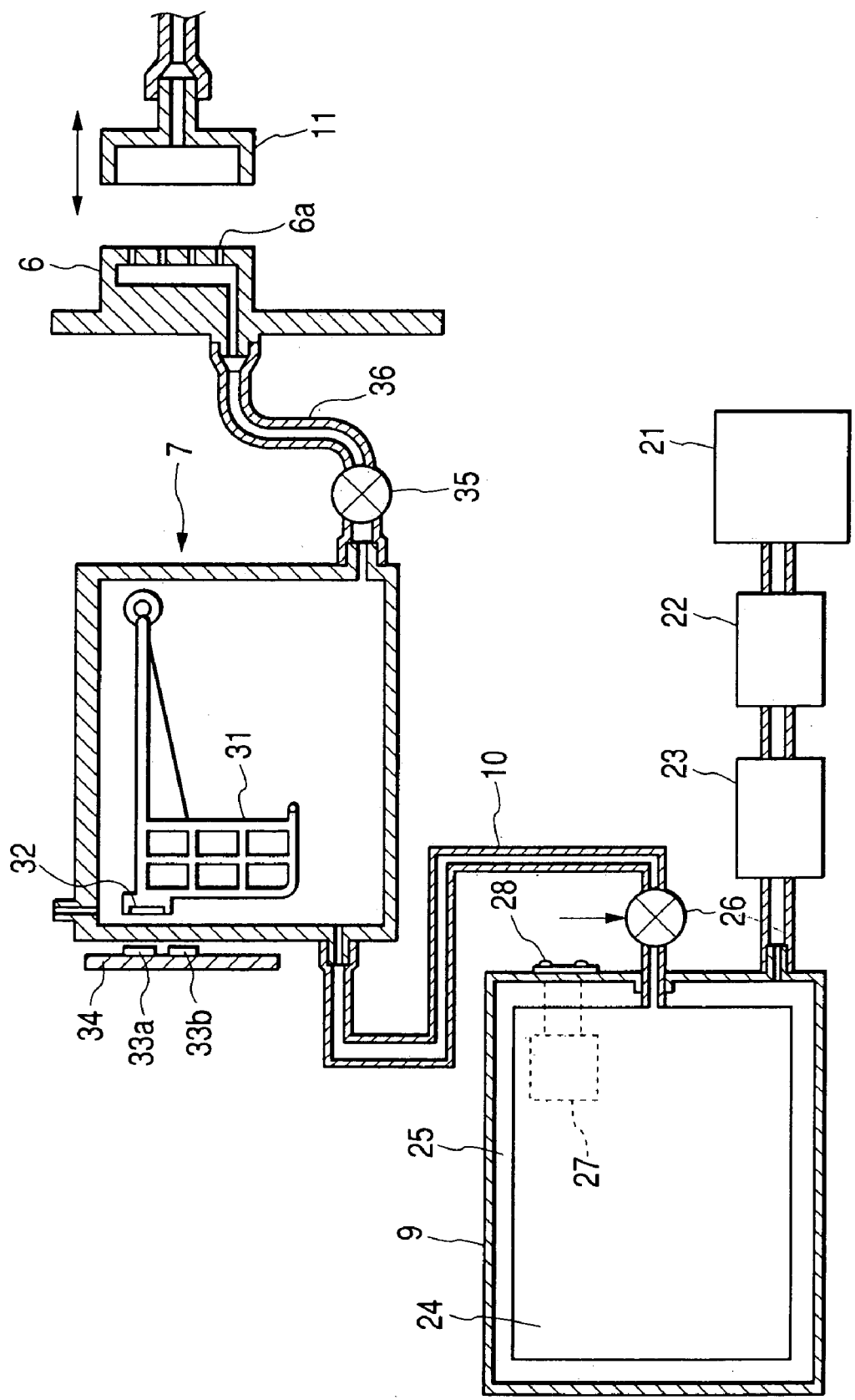
FIG. 2 is a schematic view illustrating an ink supply system including from ink cartridges to a recording head.

Referring next to FIG. 2, there is shown a schematic view of the configuration of the ink supply system mounted on the recording apparatus illustrated in FIG. 1. This ink supply system is described hereinbelow by referring to FIG. 2 and FIG. 1, in which the ink supply system is designated by the same reference character. In FIGS. 1 and 2, reference character 21 denotes an air compression pump 21. This system is configured so that air pressurized by this air compression pump 21 is supplied to a pressure regulating valve 22, and that then, such air is supplied to each of the main tanks 9a to 9d (in FIG. 2, the main tanks are collectively and simply denoted by reference character 9, and hereunder, the main tanks are sometimes designated simply and generically by reference character 9) through a pressure sensor 23.

In this case, the system is configured so that air flow channels branch from the pressure sensor 23 to the main tanks 9, and that pressurized air is applied to the main tanks loaded in the cartridge holder 8. The pressure regulating valve 22 has a function of decompressing air and maintaining the air pressure, which is applied to each of the main tanks 9a to 9d, within a predetermined range when the air pressurized by the air compression pump 21 reaches an overpressurized state owing to some trouble.

Further, the pressure sensor 23 functions in such a way as to detect the air pressure pressurized by the air compression pump 21 and as to control an operation of driving the air compression pump 21. That is, when the sensor 23 detects that the air pressure pressurized by the air compression pump 21 reaches a predetermined pressure, the sensor 23 stops the operation of driving the air compression pump 21 according to this detected fact. Conversely, when the sensor 23 detects that the air pressure pressurized by the air compression pump 23 becomes equal to or less than a predetermined pressure, the system controls the sensor 23 in such a manner as to drive the air compression pump 21. By repeating such operations, the pressure sensor 23 functions in such a way as to maintain the air pressure applied to each of the main tanks 9a to 9d within the predetermined range.

As is seen from FIG. 2 schematically showing the configuration of the main tank 9, a case constituting an outer part thereof is formed in such a way as to be in an airtight state. An ink pack 24 made of a flexible material, in which ink is contained, is accommodated in the main tank 9. Further, the main tank 9 is configured so that a space defined by the main tank 9 and the ink pack 24 constitutes a pressure chamber 25, and that pressurized air is supplied into this pressure chamber 25 through the pressure sensor 23.

With this configuration, the ink pack 24 accommodated in each of the main tanks 9a to 9d is pressurized by the pressurized air, so that an ink flow from each of the main tanks 9a to 9d to a corresponding one of the subtanks 7a to 7d is generated by a predetermined pressure.

Incidentally, as shown in FIG. 2, a circuit board 27, on which a semiconductor storage element (a memory device) implemented by, for example, EEPROM is mounted, is attached to a part of the case of the main tank 9 serving as an ink cartridge. For example, information on the kind (for instance, information for discriminating dye ink or pigmented ink), color, and remaining amount of ink contained in the ink cartridge is stored in the semiconductor storage element mounted on this circuit board 27. Further, as illustrated in FIG. 2, a terminal 28 (this corresponds to the contact pad 62), at which the information can be read from and written to the semiconductor storage element, is disposed at a part of the main tank 9, and configured so as to be able to be electrically connected to the recording apparatus in the case that the main tank 9 is attached to the recording apparatus.

Meanwhile, the system is configured so that ink pressurized in each of the main tanks 9a to 9d is supplied to a corresponding one of the subtanks 7a to 7d mounted on the carriage 1 (in FIG. 2, the subtanks are collectively designated by reference character 7, and hereunder, the tanks are sometimes denoted simply and generically by reference character 7) through a corresponding one of the ink supply valve 26, . . . , 26 and a corresponding one of the ink supply tubes 10, . . . , 10.

The basic configuration of this subtank 7 is established so that a float member 31 is disposed therein, and that a permanent magnet 32 is attached to a part of the float member 31. Further, magnetoelectrical conversion elements 33a and 33b typified by Hall elements are mounted on the circuit board 34, and attached and connected to a side wall of the subtank 7.

With this configuration, an ink amount detecting means is constituted by including the float member 31, the permanent magnet 32 disposed on the float member 31, and output generating means for outputting an electrical output generated by the Hall elements 33a and 33b according to a magnetic dose that is generated by the permanent magnet 32 according to a position to which the float member rises.

In this embodiment, the ink amount detecting means is utilized in such a way as to detect that an amount of ink contained in each of the subtanks 7 reaches a predetermined amount (corresponding to an ink full state) by supplying ink from each of the main tanks 9 to a corresponding one of the subtanks 7. In this case, the system is configured so that the ink supply valve 26 is closed according to the electrical output of the Hall elements 33a and 33b.

Further, in the case where it is detected from the electrical outputs of the Hall elements that opened according to the electrical outputs of the Hall elements 33a and 33b that the amount of ink contained in the subtank reaches an amount (corresponding to a low ink-amount state), which is equal to or less than a predetermined volume, by performing a print operation, the system operates in such a way as to open the ink supply valve 26. Thus, the ink pressurized in each of the individual main tanks 9 is supplied to a corresponding one of the subtanks 7, in which the consumption of ink progresses. Therefore, the system operates so that ink is intermittently supplied from the main tanks to the subtanks by repeating the operations as described above, and that ink of an amount, which is within a predetermined range, is always stored in each of the subtanks.

Furthermore, as illustrated in FIG. 2, the system is configured so that ink is supplied from each of the subtanks 7 to the recording head 6 through the valve 35 and the tube 36 connected thereto. The system operates so that ink droplets are outputted from a nozzle opening 6a formed in the nozzle formation surface of the recording head 6 according to print data supplied to an actuator (not shown) of the recording head 6. Incidentally, in FIG. 2, reference character 11 designates the capping means. The tube connected to this capping means 11 is also connected to a suction pump (not shown).

Figure 3:
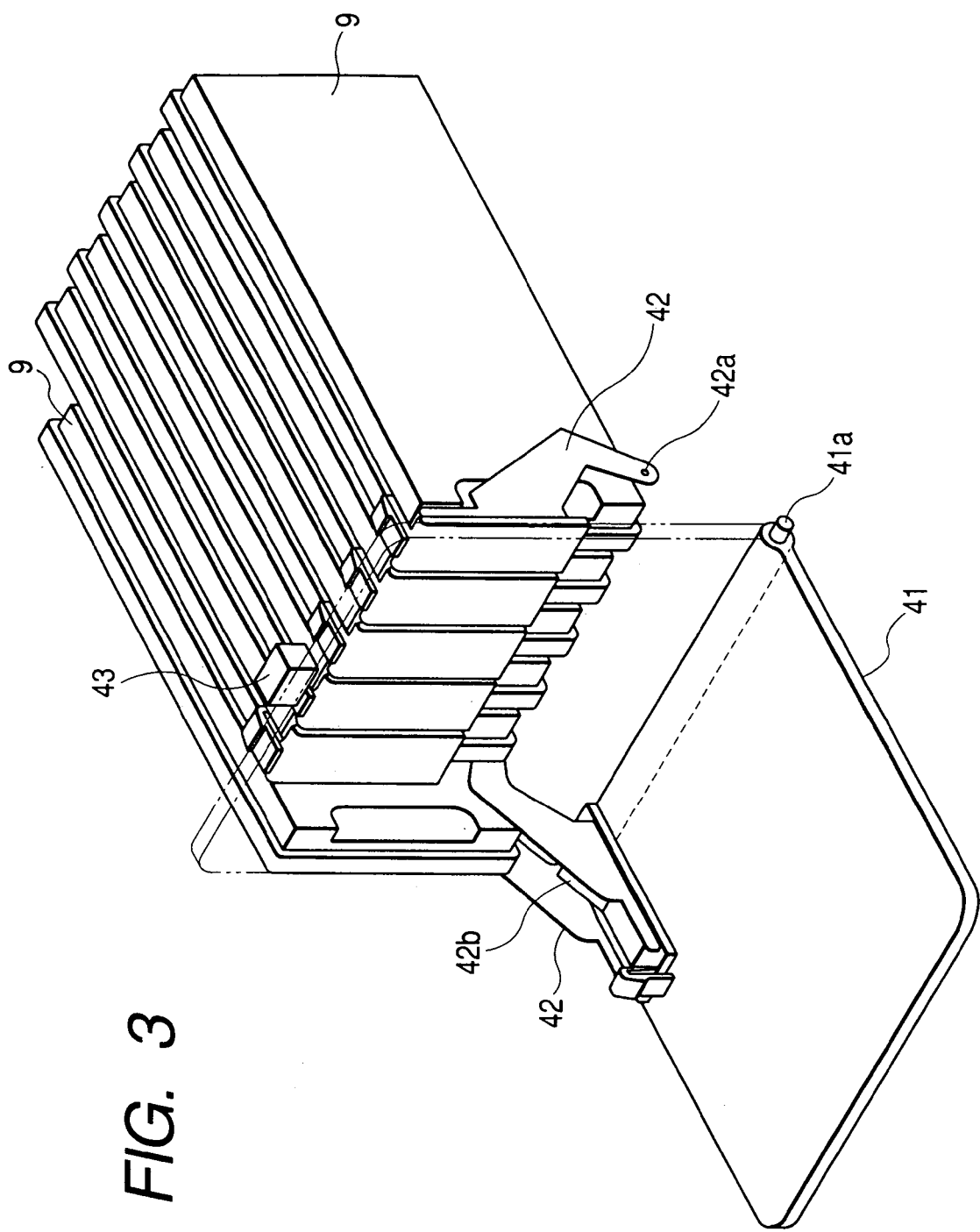
FIG. 3 is a perspective view illustrating the configuration of a front-side part of a cartridge holder.

Referring next to FIG. 3, there is shown a view of the configuration of a front-side part of the cartridge holder 8. A cover member 41, which is opened when the main tank is attached thereto or detached therefrom, is equipped in this cartridge holder 8. That is, the system is configured so that this cover member 41 is placed at an opening front face of the cartridge holder 8, that a turning shaft 41a is supported by a support hole (not shown) formed in the main unit of the recording apparatus, and that the opening front face of the cartridge holder 8 can be opened (corresponding to a state indicated by solid lines) or closed (corresponding to a state indicated by chain lines) by turning the cover member 41 around the turning shaft 41a.

A plurality of operating levers 42 are disposed inside the closed cover member 41 correspondingly to the main tanks 9 loaded in the cartridge holder 8. A locking hole 42a is formed in each of a base part of each of these operating levers 42. Each of the operating levers 42 is turnably supported by a supporting rod inserted into the locking hole 42a formed therein.

Further, each of the main tanks 9 can be loaded or unloaded by turning the operating levers 42 in the same direction as the direction, in which the cover member 41 is opened, during a state in which the cover member 41 is opened. That is, when the main tank 9 is loaded into the cartridge holder 8, the main tank 9 is inserted thereinto during the operating levers 42 are turned in the same direction as that in which the cover member 41 is opened. Then, the operating levers 42 are setup. Thus, a pressing portion 42b formed in each of the operating levers 42 abuts against a front-side end portion of a corresponding one of the main tanks 9, so that the main tanks 9 are loaded in the holder 8 according to the principle of leverage.

Furthermore, when the main tank 9 loaded in the holder 8 is drawn out therefrom, the operating levers 42 are turned in the same direction as that in which the cover member 41 is opened. Thus, although not shown in the figure, the main tank 9 is pushed out from the back side of the holder 8 through a link rod engaged with a part of the operating levers 42. Consequently, the main tank 9 pushed out in the direction of a near side, as viewed in the figure, can be easily pulled out.

An electrical switch 43 for detecting the opening of the cover member 41 is further provided in the cartridge holder 8. For example, a tact switch is used as this switch 43 which is put into an on-state by being in contact with the rear surface of the cover member 41 during the state in which the cover member 41 is closed, and which is put into an off-state during the state in which the cover member 41 is opened. This switch 43 is adapted to forcedly open the pressure regulating valve 22 during the off-state. Thus, during each of the ink cartridges is exchanged, when the cover member 41 is opened, the switch 43 operates in such a way as to cause the pressurized air, which is provided to each of the ink cartridges, to flow into the air.

Figure 4:
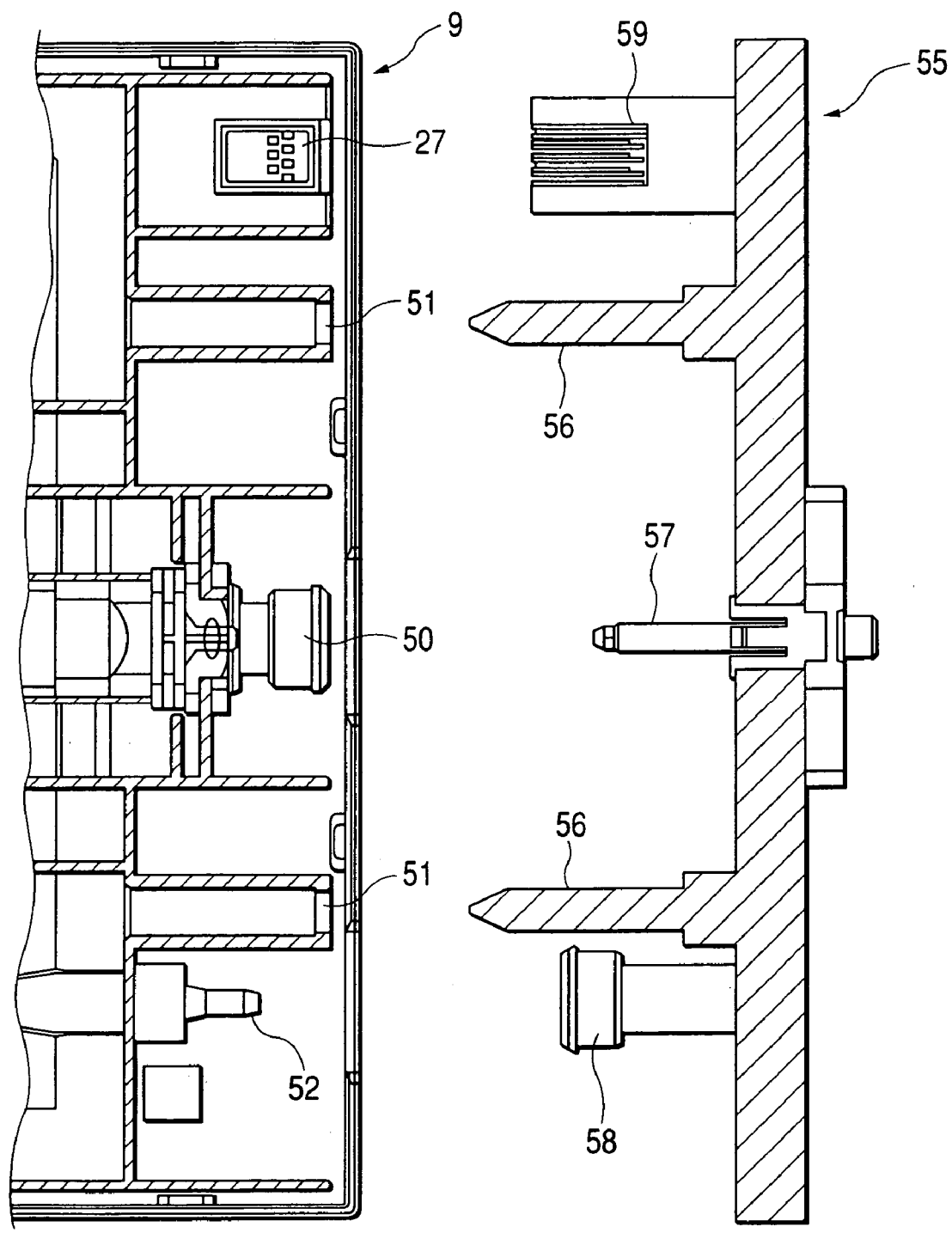
FIG. 4 is a view illustrating the configuration of each of opposed parts of a connection mechanism, which is disposed in the cartridge holder, and the ink cartridge.

FIG. 4 is a sectional view of the configuration of a connection mechanism placed in the cartridge holder 8 and the configuration of an end portion of the main tank 9 serving as an ink cartridge. Paired opening holes 51 each serving as a positioning means utilized when loading the ink cartridge into the recording apparatus are formed in each of the main tanks 9 serving as ink cartridges. Further, an ink outlet part 50 for leading ink out of the ink pack 24 is mounted in an almost middle portion intervening between the paired positioning opening-holes 51. Further, an inlet port 52 for pressurized air, and a circuit board 27, on which a semiconductor storage element enabled to reading/writing of information on the ink cartridge is mounted, are disposed on both outer sides of each of the opening holes 51 formed in the two places.

Meanwhile, paired positioning pins 56 each formed like a cylinder are placed in a connection mechanism 55 placed in the cartridge holder 8. The system is configured so that the paired positioning opening-holes 51 formed in the main tank 9 are provided in such a way as to surround each of the positioning pins 56.

Thus, the positioning opening-holes 51 are placed at two places in the case of the main tank 9. Consequently, the three-dimensional positioning of the main tanks 9 serving as the cartridges can be achieved by attaching the two positioning pins 56, which are placed on the recording apparatus, to the base part. A hollow ink inlet tube 57 disposed at a nearly central part intervening the paired positioning pins 56 is inserted into the ink outlet part 50 for leading ink out of the ink pack 24, so that the system is put into a condition in which ink can be led out from the cartridges.

Further, an inlet port 52 for pressurized air is connected to an outlet port 58 for pressurized air, which is placed in the cartridge holder 8, by loading the main tank 9 thereinto. Thus, the system is put into a condition in which pressurized air is introduced into the main tank 9. Moreover, a terminal mechanism 59 having a plurality of connector terminals is connected to the circuit board 27 placed on the main tank 9. Thus, the system is brought into a condition in which the transfer of data between the semiconductor storage element provided on the circuit board 27 and the terminal can be realized.

Figure 5:
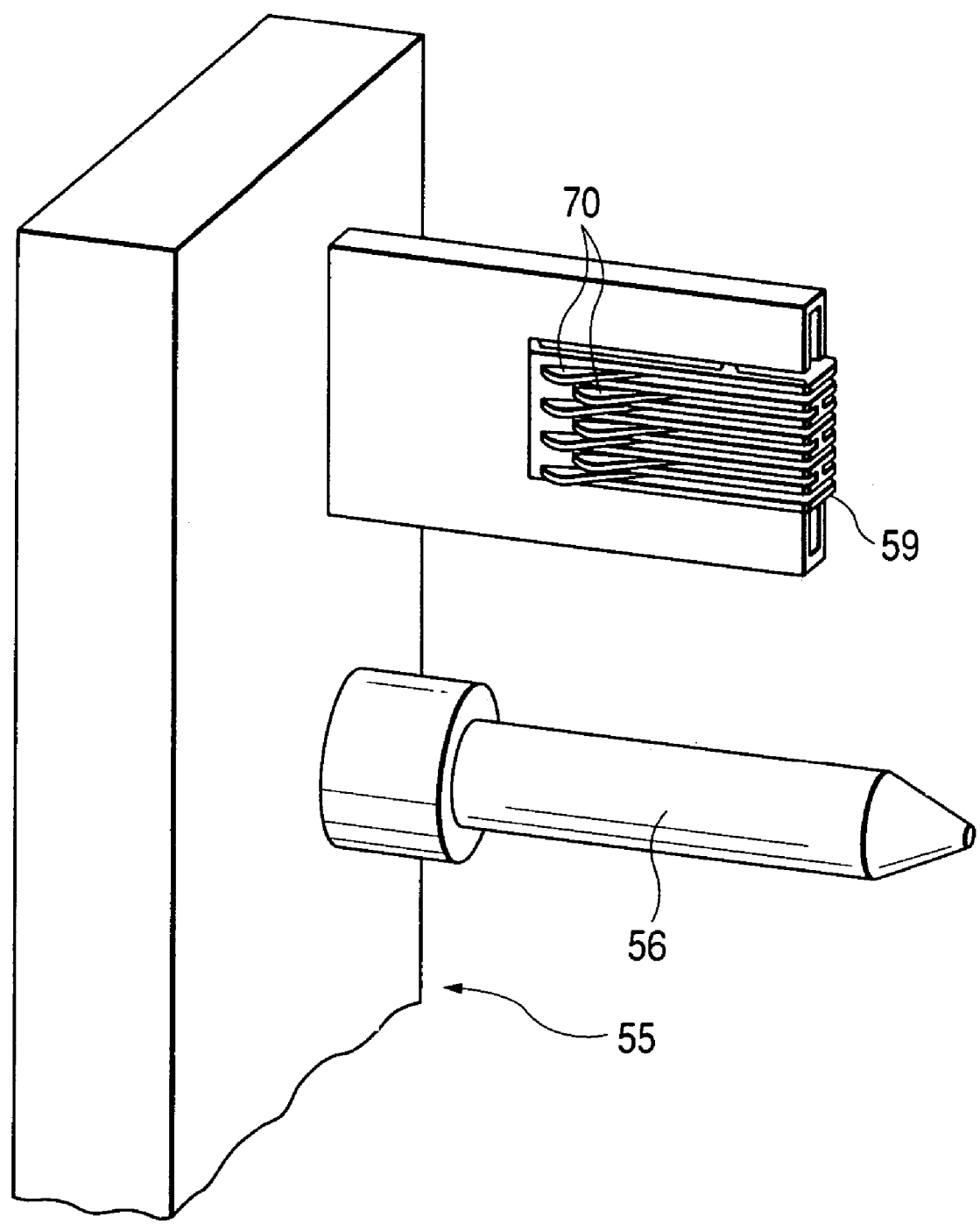
FIG. 5 is a perspective view illustrating a terminal mechanism part of the connection mechanism shown in FIG. 4 by enlarging the terminal mechanism part.

FIG. 5 illustrates the configuration of the terminal mechanism 59, which is taken from the back surface thereof in contrast with FIG. 4 taken from the opposite surface thereof. That is, FIG. 5 shows the configuration in which the connector terminals 70 to be electrically contacted with the surface of the circuit board 27 placed on the main tank 9 are arranged. Each of these connector terminals 70 is formed from an elastic metal material, for example, phosphor bronze, and has seven terminals that respectively correspond to the contact pads formed on the circuit board 27 of the main tank 9 and that are arranged in what is called a staggering manner.

Further, each of the end portions of the connector terminals 70 is formed like an arc. The end portions of the connector terminals 70 are configured so that when the connector terminals 70 are brought into relative contact with a surface of the circuit board from a direction of the surface thereof, the arcuate outer peripheral surface is put into slide contact with the circuit board surface. Thus, when the main tank is detached and attached, the frictional resistance of each of the connector terminals 70, which is put into slide contact with the circuit board surface, can be reduced. Further, each of the connector terminals 70 are connected to a read/write circuit (not shown) mounted on the recording apparatus. Data is transferred between this circuit and the semiconductor storage element mounted on the circuit board 27.

Figure 6A:
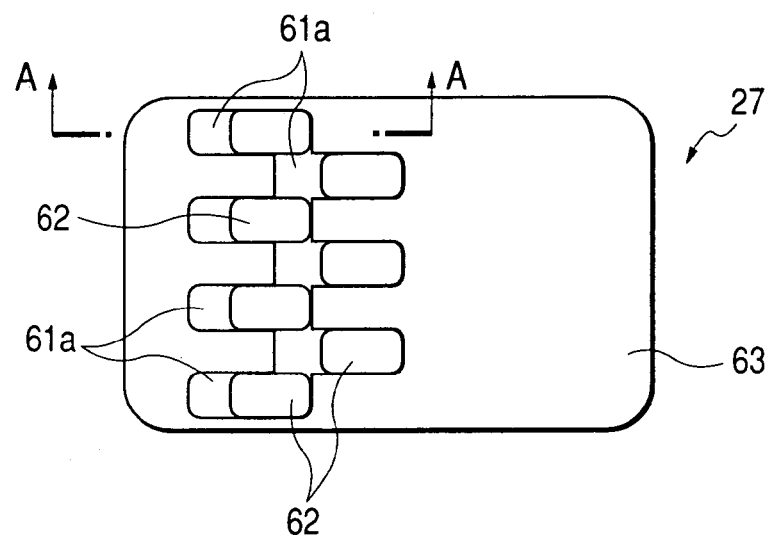
FIGS. 6A and 6B (6C) are configuration views each illustrating a first preferred embodiment of a circuit board.
Figure 6B:
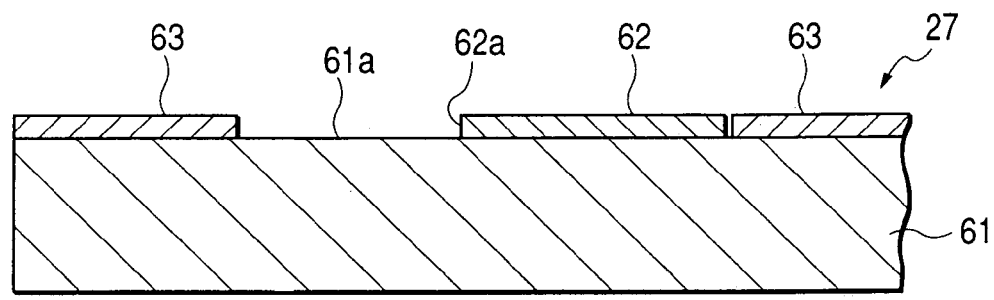
Figure 6C:
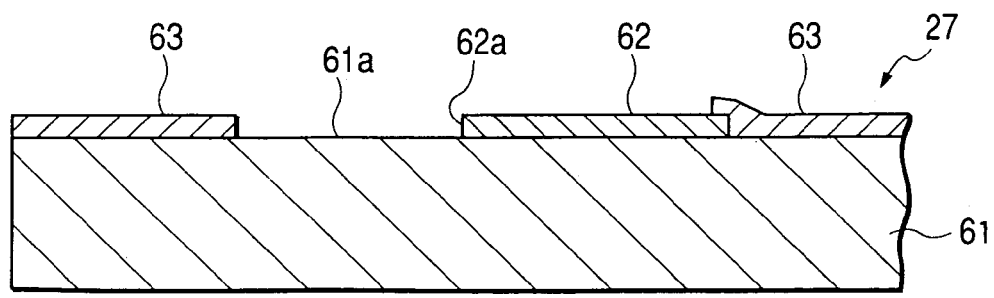
Figure 10A:
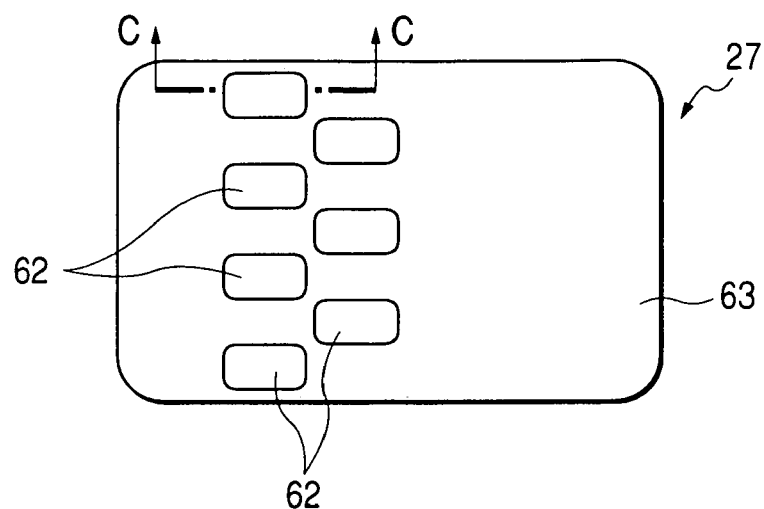
FIGS. 10A and 10B (10C) are configuration views each illustrating a conventional circuit board.
Figure 10B:
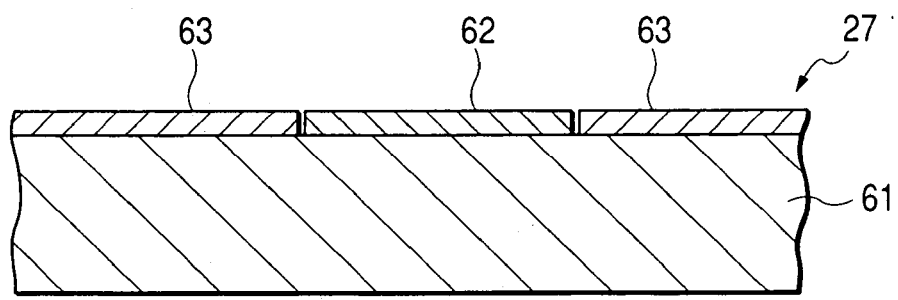
Figure 10C:
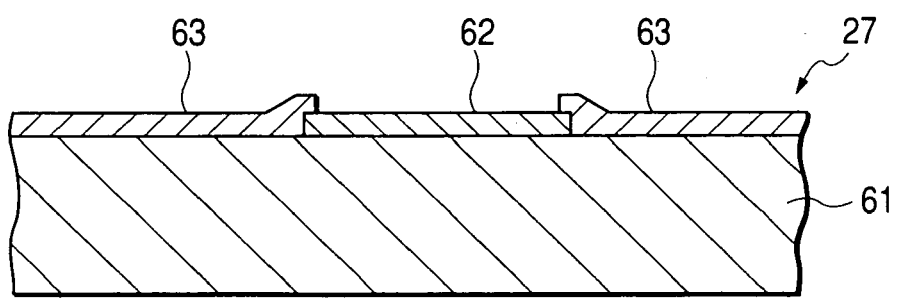

Meanwhile, FIGS. 6A and 6B (6C) illustrate a first preferred embodiment of the circuit board (IC chip) 27 placed on the ink cartridge serving as the main tank 9. Further, FIG. 6A is a plan view of the circuit board, which is taken from above the top surface. FIG. 6B (6C) is an enlarged sectional view of the circuit board, which is taken from line A-A in the direction of arrows shown in FIG. 6A. Incidentally, the basic configuration of this circuit board 27 is similar to the circuit board previously described with reference to FIGS. 10A and 10B (10C). Therefore, the corresponding portions are designated by the same reference characters.

The circuit board 27 shown in FIGS. 6A and 6B (6C) is coated with solder resist film 63 with the exception of places, at which the contact pads 62 are formed, and portions that are on the path of the connector terminals 70 coming in slide contact with the contact pads 62 and that are adjacent to the contact pads 62. Incidentally, the thickness of each of the contact pads 62 is about 40 µm or so. Similarly, the thickness of the resist film 63 is about 40 µm or so. Hence, as illustrated in FIG. 6B (6C), a no-resist-film formation part 61a, on which resist film 63 is not formed, that is, an exposed part of the circuit board base (substrate) 61 is formed as a concave part that is about 40 µm in depth. Consequently, a step portion 62a is formed between the circuit board surface 61a serving as a part, on which the resist film 63 is not formed, and the surface of each of the contact pads 62 formed from metallic foil (for example, copper foil).

Figure 11:
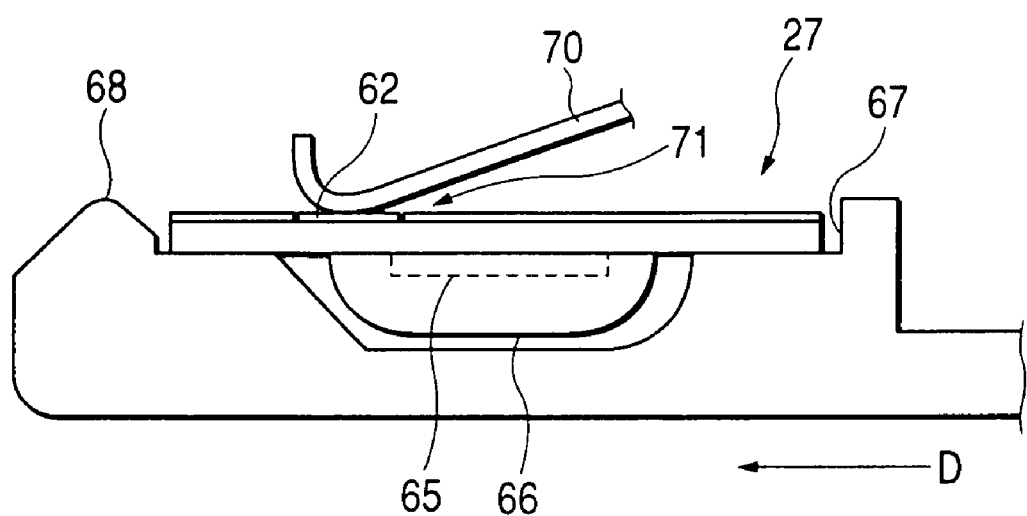
FIG. 11 is an operation explanatory view illustrating an operation in the case of using the circuit board shown in FIG. 10.

FIGS. 7A, 7B, 7C and 7D illustrate the manners, in which the connector terminals 70 are brought into relative slide contact with the circuit board 27 of the aforementioned configuration, in sequence. Incidentally, similarly as the semiconductor storage element of the circuit board of the configuration illustrated in FIG. 11, a semiconductor storage element (memory device) 65, for example, EEPROM is mounted on the rear surface of the circuit board 27, and electrically connected to the contact pads 62 through circuit patterns (not shown) and through holes (not shown). Furthermore, the semiconductor element 65 is fixed onto the rear surface of the circuit board 27 by a mold resin 66. Furthermore, as described with reference to FIG. 11, the circuit board 27 is attached to the ink cartridge so that the contact pads 62 are located at a leading end portion of a case formed from a synthetic resin, which constitutes an outer part of the ink cartridge, in such a way as to place on the surface thereof.

Figure 7A:
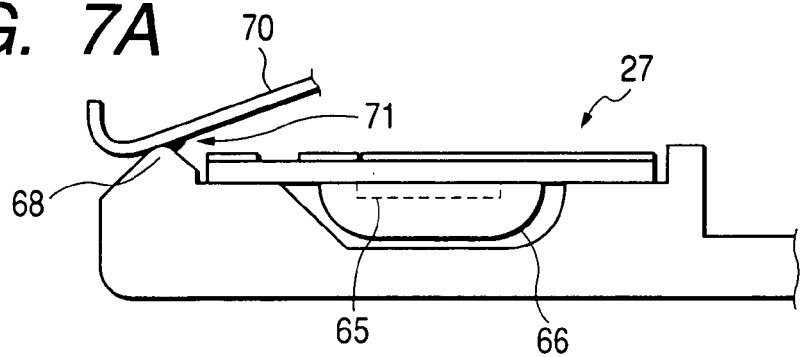
FIGS. 7A, 7B, 7C, and 7D are operation explanatory views each illustrating an operation in the case of using the circuit board shown in FIGS. 6A and 6B (6C).

Incidentally, FIG. 7A illustrates an initial state in the case that the ink cartridge 9 is loaded into the cartridge holder 8. Then, the process of loading the ink cartridge is performed through steps illustrated in FIGS. 7B and 7C. FIG. 7D illustrates a state in which the loading of the ink cartridge 9 is completed. First, in the case that the ink cartridge is loaded into the cartridge holder as illustrated in FIG. 7A, the end portion of the connector terminal 70 disposed on the cartridge holder 8 is caused to override a projecting part 68 formed on the ink cartridge. At that time, the projecting part 68 undergoes the slide contact with the connector terminal 70. A part of a synthetic resin material constituting the outer case of the cartridge is worn, and the worn material becomes floury dust 71, which then adheres to the connector terminal 70.

Figure 7B:
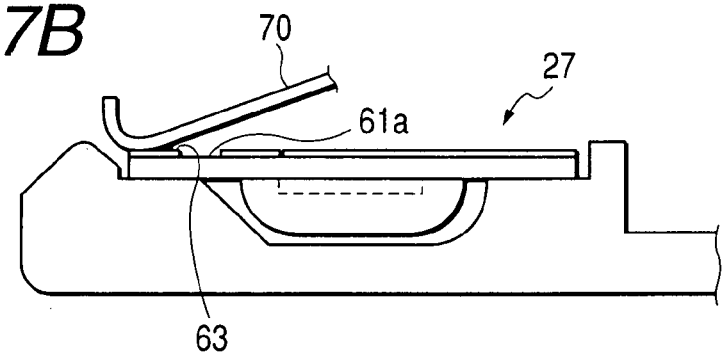
Figure 7C:
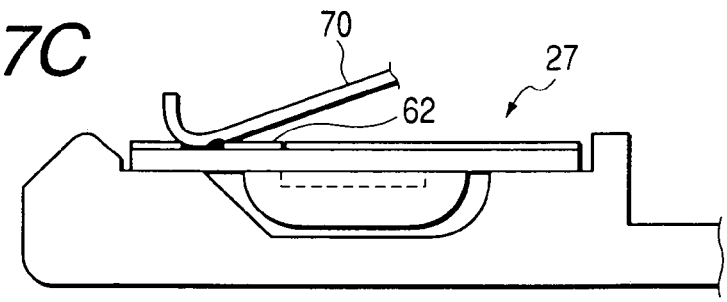
Figure 7D:
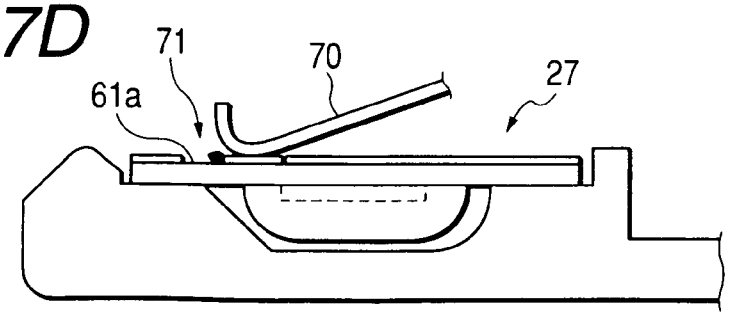

Subsequently, as illustrated in FIG. 7B, the connector terminal 70 comes in slide contact with the top surface of the resist film 63 formed on the circuit board surface with the dust 71 adheres thereto. Moreover, as illustrated in FIG. 7C, the connector terminal 70 falls to the part 61a, on which no resist film is formed, provided nearest to the contact pad 62. Finally, as illustrated in FIG. 7D, the connector terminal 70 undergoes elastic deformation and runs upon the top surface of the contact pad 62, so that the connector terminal 70 comes in contact with the contact pad 62. At that time, the dust adhering to the connector terminal 70 is wiped by the step portion 62a formed owing to the thickness of the contact pad 62.

Therefore, the frequency of causing the dust to intervene between the contact pad and the connector terminal can be reduced. The reliability of the electrical contact between the connector terminal and the contact pad can be ensured. Further, the effect of wiping the dust adhering to the connector terminal can be enhanced because the step portion 62a is constituted by metal foil that constitutes the contact pad 62.

Incidentally, in the configuration of the circuit board 27 described with reference to FIGS. 6A to 7D, the resist film 63 is applied on the surface of the circuit board. However, in the case that no circuit patterns are present on the path on which the connector terminals 70 come in slide contact with the circuit board 27, the resist film 63 can be omitted. That is, the resist film 63 serves to prevent the circuit pattern from undergoing electrical trouble by touching the connector terminal 70. Therefore, in other words, in the case that a circuit pattern is present on the path, on which the connector terminals 70 come in slide contact with the circuit board 27, resist film may be formed only on the part of the path where the circuit pattern is present.

Figure 8A:
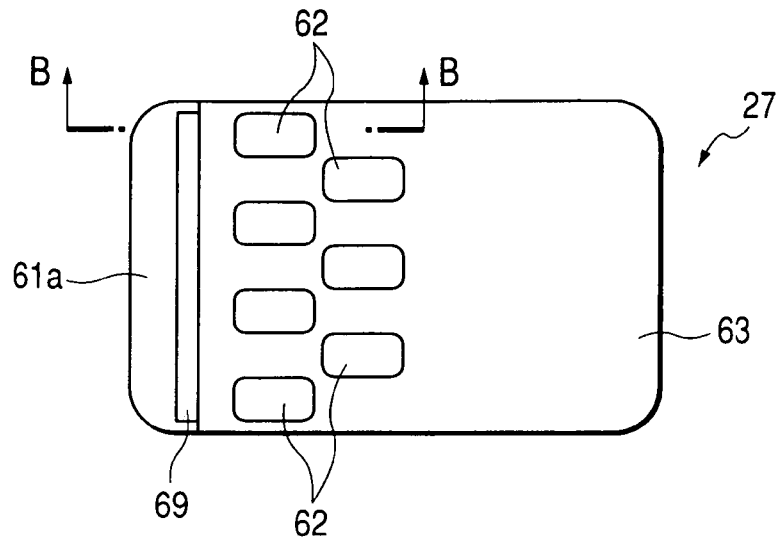
FIGS. 8A and 8B (8C) are configuration views each illustrating a second preferred embodiment of the circuit board.
Figure 8B:
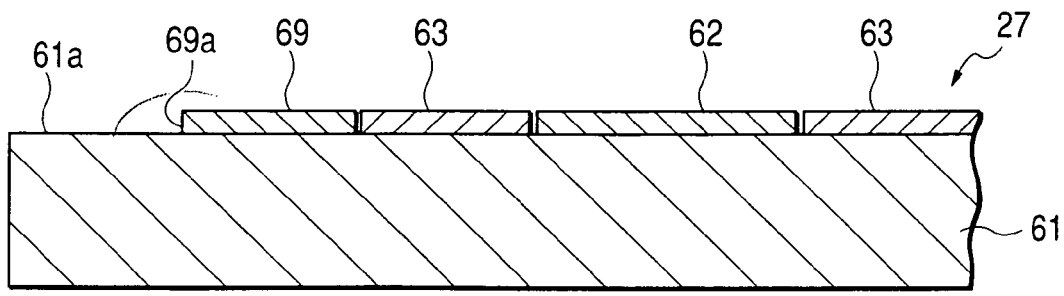
Figure 8C:
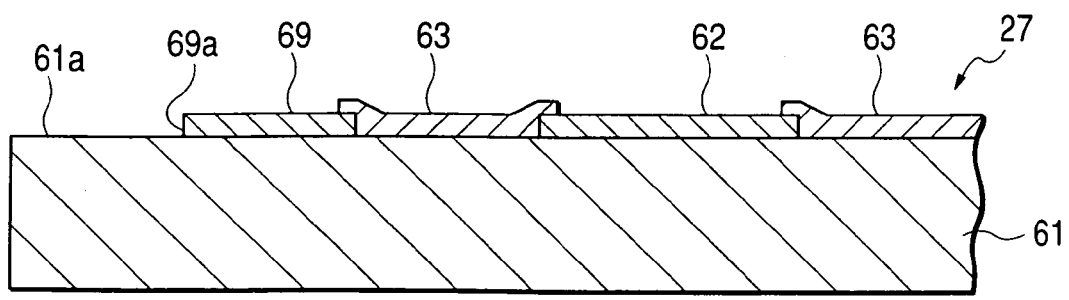

FIGS. 8A and 8B (8C) illustrate a second preferred embodiment of the circuit board 27. Further, FIG. 8A is a plan view taken from above the top surface of the circuit board. FIG. 8B (8C) is an enlarged sectional view taken from line B-B in a direction of arrows shown in FIG. 8A. Incidentally, the basic configuration of this circuit board 27 is similar to the circuit board previously described with reference to FIGS. 6A and 6B (6C). Therefore, the corresponding portions are denoted by the same reference characters.

In the second example of this circuit board 27, a dummy pattern 69 made of metallic foil is formed on the path, on which the connector terminals 70 come in slide contact with the circuit board 27. This dummy pattern 69 is formed on the circuit board base 61 simultaneously when the contact pads 62 and the circuit patterns (not shown) are formed thereon by an etching process. Therefore, the dummy pattern 69 can be formed so that the thickness thereof is nearly equal to the thickness of the contact pad 62.

Further, in the case of this embodiment, the circuit board is coated with solder resist film with the exception of places, where the contact pads are formed, and positions (that is, the left-side area, as viewed in each of FIGS. 8A and 8B (8C)) that are on the slide contact path of connector terminals 70 and that are more front than the dummy pattern. This configuration utilizes the thickness of the dummy pattern 69 to define a step portion 69a that rises relative to the portion 61a, on which the resist film 63 is not formed, that is, the exposed part of the circuit board base 61.

Therefore, similarly as the step portion of the example described with reference to FIGS. 7A to 7D, the step portion 69a performs an operation of wiping the dust adhering to the connector terminals 70. Hence, the embodiment of the configuration illustrated in FIGS. 8A and 8B (8C) can obtain operations and effects similar to those of the embodiment of the configuration illustrated in FIGS. 6A to 7D. Incidentally, preferably, the dummy pattern 69 is insulated from the circuit patterns (not shown) arranged on the circuit board 27. With this configuration, the semiconductor storage element 65 mounted on the circuit board 27 can be prevented from undergoing electrical troubles when the connector terminal 70 touches the dummy pattern 69.

Figure 9:
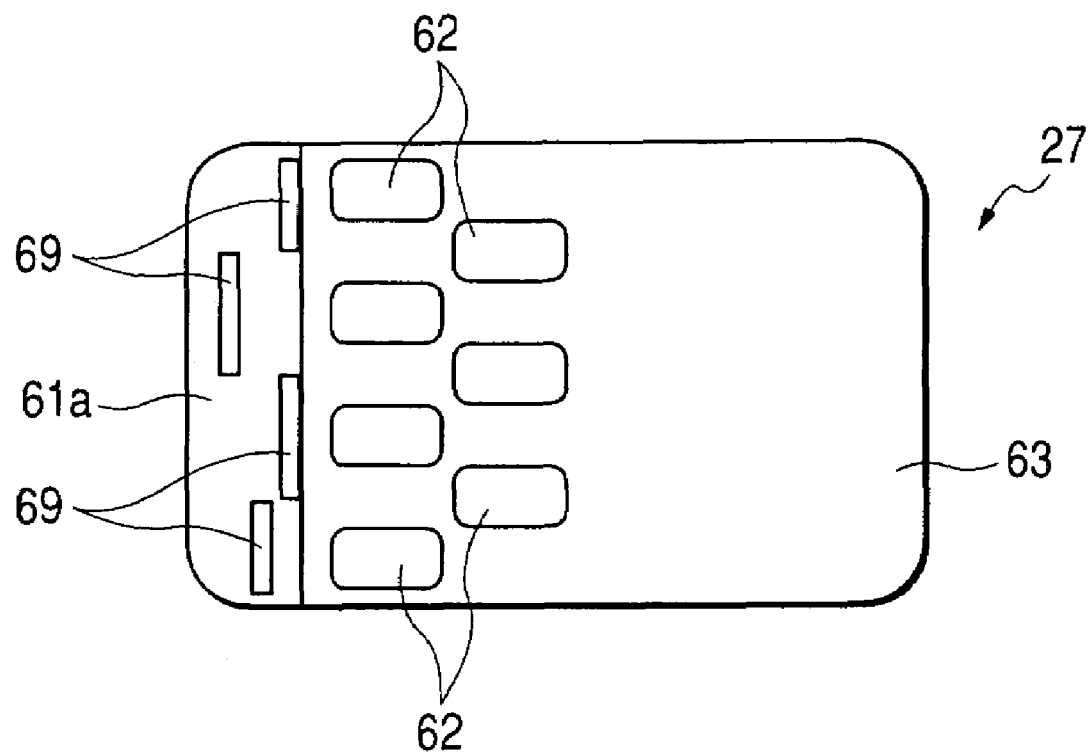
FIG. 9 is a configuration view illustrating a third preferred embodiment of the circuit board.

Referring further to FIG. 9, there is shown a plan view of a third preferred embodiment of the circuit board 27. Incidentally, even in this FIG. 9, parts corresponding to the previously described portions are designated by the same reference characters. In the embodiment illustrated in this FIG. 9, the dummy patterns 69 are formed on the slide contact path of the connector terminals in such a manner as to separate from one another correspondingly to the plural connector terminals. Even in the case of the circuit board of this configuration, similarly as in the embodiment illustrated in FIGS. 8A and 8B (8C), a step portion 69a corresponding to the thickness of the dummy pattern 69 is formed on the exposed part 61a of the circuit board base 61. This step portion performs an operation of wiping the dust adhering to the connector terminal 70, similarly as the embodiments already described. Thus, even in the circuit board of the configuration illustrated in FIG. 9 can obtain operations and effects similar to those of the embodiments already described.

Incidentally, according to the configuration illustrated in FIG. 9, the dummy patterns 69 are formed on the slide contact path of the connector terminals in such a way as to separate from one another correspondingly to the plural connector terminals. Therefore, the connector terminals 70 can be prevented from being short-circuited to one another through the dummy patterns 69 when each of the connector terminals 70 passes on the dummy pattern 69 by being put into slide contact therewith. Consequently, a read/write circuit (not shown) mounted on the recording apparatus can be prevented from undergoing electrical troubles.

As described above, according to a circuit board of this invention, a step portion is formed on a path of a connector terminal coming into slide contact with a circuit board having a contact pad. Thus, dust adhering to the connector terminal can be removed by the step portion. Consequently, the reliability of the electrical contact between the contact pad and the connector terminal can be ensured.

Further, in the case where a projecting part is formed to prevent the connector terminal from coming in contact with the end portion of the circuit board, dust adhering to the connector terminal due to wear of the projecting part can be removed by the step portion.

Further, proper operation of the recording apparatus can be ensured by utilizing the connection apparatus of the invention in the ink jet type recording apparatus configured so that a signal is transferred between the main unit thereof and the circuit board mounted on the ink cartridge in the state in which the circuit board is mounted on the ink cartridge. The reliability of operations of such a kind of the ink jet type recording apparatus can be assured.

In addition, in the arrangement (1) discussed above, the first surface of the substrate exposed by the non-resist film portion may have an additional layer (a thin film, a protective layer, etc.) applied thereon as long as the non-resist film portion and the contact pad define the step therebetween.

Similarly, in the arrangement (8) discussed above, the first surface of the substrate exposed by the non-resist film portion may have an additional layer (a thin film, a protective layer, etc.) applied thereon as long as the non-resist film portion and the dummy pattern define the step therebetween.

Similarly, in the arrangement (19) discussed above, the bottom of the recessed portion may be formed by the first surface of the substrate, and alternatively may be formed by a surface of an additional layer (a thin film, a protective layer, etc.) applied on the first surface of the substrate.

In the arrangement (24) discussed above, the first surface forming the step portion may be formed by a surface of a substrate base, and alternatively may be formed by an additional layer (a thin film, a protective layer, etc.) applied on the surface of the substrate base.

In the arrangement (25) discussed above, the first surface forming the step portion may be formed by a surface of a substrate base, and alternatively may be formed by an additional layer (a thin film, a protective layer, etc.) applied on the surface of the substrate base.

What is claimed is:

1. A circuit board comprising:
   a substrate;
   a contact pad formed on a first surface of the substrate, and to be connected to a connector terminal by coming in sliding contact with the connector terminal;
   a dummy pattern formed on the first surface, and at least partially aligned with the contact pad along a direction in which the connector terminal is connected to the contact pad;
   a step portion formed by the first surface and the dummy pattern, and located at an upstream side of the contact pad in the direction in which the connector terminal is connected to the contact pad; and
   a resist film formed on the first surface of the substrate in a downstream direction from the dummy pattern and in an upstream direction from the contact pad such that the resist film is between the dummy pattern and the contact pad.

2. The circuit board according to claim 1, further comprising:
   a resist film portion on the first surface; and
   a non-resist film portion having the step portion.

3. The circuit board according to claim 1, further comprising:
   a memory device on a second surface of the substrate opposite from the first surface.

4. The circuit board according to claim 1, wherein a plurality of the dummy patterns are disposed.

5. The circuit board according to claim 4, wherein:
a plurality of the contact pads are disposed to form a staggered arrangement;
the plurality of the dummy patterns are disposed correspondingly to the contact pads to form a staggered arrangement.

6. The circuit board according to claim 1, wherein a height of the step portion is substantially equal to a thickness of the dummy pattern.

7. An ink cartridge comprising:
an ink storing portion storing at least ink;
an ink supply port communicating with the ink storing portion; and
the circuit board recited in any one of claims 1, 4, 5, and 6.

8. The ink cartridge according to claim 7, further comprising:
a mounting portion at which the circuit board is mounted to the ink cartridge;
a projecting portion located at an upstream side of the mounting portion in the direction in which the connector terminal is connected to the contact pad,
wherein the projecting portion extends beyond the contact pad.

* * * * *